US012199608B2

(12) United States Patent
Nilchi et al.

(10) Patent No.: US 12,199,608 B2
(45) Date of Patent: Jan. 14, 2025

(54) SYSTEM AND APPARATUS FOR ON-SUBSTRATE CIRCUIT CONFIGURED TO OPERATE AS TRANSFORMER

(71) Applicant: Avago Technologies International Sales Pte. Limited, Singapore (SG)

(72) Inventors: Alireza Nilchi, Irvine, CA (US); Adesh Garg, Aliso Viejo, CA (US); Mohammad Elbadry, Foothill Ranch, CA (US); Ahmed Elkholy, Irvine, CA (US); Jun Cao, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 64 days.

(21) Appl. No.: 17/963,040

(22) Filed: Oct. 10, 2022

(65) Prior Publication Data

US 2024/0120905 A1 Apr. 11, 2024

(51) Int. Cl.
*H03H 11/32* (2006.01)
*H03K 3/012* (2006.01)

(52) U.S. Cl.
CPC ............. *H03K 3/012* (2013.01); *H03H 11/32* (2013.01)

(58) Field of Classification Search
CPC ............................... H03K 3/012; H03H 11/32
See application file for complete search history.

(56) References Cited

U.S. PATENT DOCUMENTS 7,171,739 B2  2/2007  Yang et al.
7,825,731 B2  11/2010 Ohnishi et al.
7,859,337 B1* 12/2010 Chu ...................... H03F 3/2171
                                              330/251
9,130,650 B1*  9/2015  Acimovic ............... H04B 3/30
9,614,694 B2   4/2017  Mei et al.
10,804,812 B1* 10/2020 Dehem ............. H02M 3/33571
(Continued)

FOREIGN PATENT DOCUMENTS

WO     2020112172 A1    6/2020

OTHER PUBLICATIONS

D. Gruber et al., "A 12-b 16-GS/s RF-Sampling Capacitive DAC for Multi-Band Soft Radio Base-Station Applications With On-Chip Transmission-Line Matching Network in 16-nm FinFET," in IEEE Journal of Solid-State Circuits, vol. 56, No. 12, pp. 3655-3667, Dec. 2021, doi: 10.1109/JSSC.2021.3109489.
(Continued)

*Primary Examiner* — Sibin Chen
(74) *Attorney, Agent, or Firm* — Quarles & Brady LLP

(57) ABSTRACT

An apparatus, a system, and a communication device. The apparatus includes a substrate and a circuit formed on the substrate. The circuit includes a first transformer having first input nodes and first output nodes. The circuit further includes a second transformer having second input nodes and second output nodes. The first input nodes of the first transformer and the second input nodes of the second transformer are connected. At least one first output node of the first output nodes of the first transformer and at least one second output node of the second output nodes of the second transformer are connected. The circuit further includes a first capacitor connected to one of the first output nodes of the first transformer and to one of the second output nodes of the second transformer. The first capacitor is connected to a first ground.

19 Claims, 5 Drawing Sheets

(56) References Cited

U.S. PATENT DOCUMENTS

| | | |
|---|---|---|
| 10,826,457 B2 | 11/2020 | Chi et al. |
| 10,892,087 B1 | 1/2021 | She et al. |
| 2005/0088376 A1* | 4/2005 | Inoue .................. G09G 3/2965 345/60 |
| 2007/0132400 A1* | 6/2007 | Lee .................... H05B 41/2822 315/274 |
| 2014/0055163 A1 | 2/2014 | Song |
| 2021/0409065 A1* | 12/2021 | Gruber .................. H01Q 23/00 |

OTHER PUBLICATIONS

Serneels, et al., "A high-voltage output driver in a 2.5-V 0.25-/spl mu/m CMOS technology," in IEEE Journal of Solid-State Circuits, vol. 40, No. 3, pp. 576-583, Mar. 2005, doi: 10.1109/JSSC.2005.843599.

* cited by examiner

SYSTEM AND APPARATUS FOR ON-SUBSTRATE CIRCUIT CONFIGURED TO OPERATE AS TRANSFORMER

TECHNICAL FIELD

The present disclosure relates generally to transformers and, more particularly, to transformers in communication devices.

BACKGROUND

In voltage-mode (VM) drivers, transmitted output swing may be determined by resistor division between a termination resistor (RT) and differential output resistance $$(R_{out}): V_{Swing,ppd} = \frac{2R_T}{R_T + R_{out}} VDD.$$

Typically to meet return loss specifications, differential output resistance Rout may be designed to be ~RT=100 Ohms. As such, output swing may be limited by supply voltage and return loss to VDD (ppd). As technology scales, power supply voltage tends to reduce; however, unfortunately, in wireless applications (e.g., fifth-generation technology standard (5G) applications), transmitted output power specifications dictated by overall system noise performance are typically larger than what can be delivered by VM drivers under existing technology's nominal supply voltage.

Existing transmit digital-to-analog converters (DACs) typically have inadequate single-ended distortion performance. Existing resistive digital-to-analog converters (RDACs) are pseudo-differential circuits and typically lack an inherently high common-mode rejection rate (CMRR). CMRR may be a metric used to quantify an ability of a device to reject common-mode signals. As such, single-ended distortion (HD2) may be inferior to differential distortion (HD3). For example, a 12.5 Ohm DAC may have worse HD2 performance compared to a 50 Ohm DAC, which can necessitate a need for higher CMRR from a subsequent off-chip balun stage.

Some existing solutions have used VM drivers with high power supplies and cascode devices to boost output amplitude; however, such solutions increase power consumption and require a level shifter from core to high power supply while maintaining reliability for pre-driver and driver circuits. Additionally, achieving high linearity (e.g., 10 or more bits) is a challenge for such solutions. Further, such existing solutions decrease VM driver output impedance to less than 100 Ohm to increase the swing, which sacrifices return loss (S11, which is another important transmitter specification).

Some existing solutions have used Guanella transformers in capacitive DAC (C-DAC) transmitter architectures, which may reduce a DAC output impedance by 4× and amplify voltage amplitude through such transformer by 2×. However, such existing Guanella transformer solutions fail to provide adequate common-mode rejection ratio (CMRR) of signals and fail to provide adequate improvement in single-ended distortion (HD2) of signals.

Some existing solutions have used off-chip (e.g., off-chip compared to the VM drivers) baluns in wireless (e.g., 5G wireless) converters to improve HD2 performance, however, such improvement is limited by the off-chip balun's CMRR, which depends on its amplitude and phase balance. As such, very expensive baluns may be required to obtain sufficiently high HD2 performance. Additionally, such off-chip solutions may require implementing an extra component on a circuit board.

SUMMARY

An apparatus is disclosed in accordance with one or more illustrative embodiments. In one illustrative embodiment, the apparatus includes a substrate and a circuit formed on the substrate. The circuit includes a first transformer having first input nodes and first output nodes. The circuit further includes a second transformer having second input nodes and second output nodes. The first input nodes of the first transformer and the second input nodes of the second transformer are connected. At least one first output node of the first output nodes of the first transformer and at least one second output node of the second output nodes of the second transformer are connected. The circuit further includes a first capacitor connected to one of the first output nodes of the first transformer and to one of the second output nodes of the second transformer. The first capacitor is connected to a first ground.

A system is disclosed in accordance with one or more illustrative embodiments. In one illustrative embodiment, the system includes a circuit, at least one first driver, and at least one second driver. The circuit includes a first transformer having first input nodes and first output nodes. The circuit further includes a second transformer having second input nodes and second output nodes. The first input nodes of the first transformer and the second input nodes of the second transformer are connected. At least one first output node of the first output nodes of the first transformer and at least one second output node of the second output nodes of the second transformer are connected. The circuit further includes a first capacitor connected to one of the first output nodes of the first transformer and to one of the second output nodes of the second transformer. The first capacitor is connected to a first ground. The circuit includes a first input terminal connected to a first of the first input nodes and to a first of the second input nodes. The circuit includes a second input terminal connected to a second of the first input nodes and to a second of the second input nodes. The circuit includes a first output terminal and a second output terminal. The at least one first driver is connected to the first input terminal. The at least one second driver connected to the second input terminal. The circuit is configured to: receive at least one first input signal from the at least one first driver; and receive at least one second input signal from the at least one second driver.

A communication device is disclosed in accordance with one or more illustrative embodiments. In one illustrative embodiment, the communication device includes a circuit. The circuit includes a first transformer having first input nodes and first output nodes. The circuit further includes a second transformer having second input nodes and second output nodes. The first input nodes of the first transformer and the second input nodes of the second transformer are connected. At least one first output node of the first output nodes of the first transformer and at least one second output node of the second output nodes of the second transformer are connected. The circuit further includes a first capacitor connected to one of the first output nodes of the first transformer and to one of the second output nodes of the second transformer. The first capacitor is connected to a first ground. The circuit includes a second capacitor connected to a second ground. The circuit includes a switch. The first capacitor is connected between one of the first output nodes of the first transformer and the switch. The second capacitor is connected between one of the second output nodes of the second transformer and the switch.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

DETAILED DESCRIPTION

Reference will now be made in detail to the subject matter disclosed, which is illustrated in the accompanying drawings. The present disclosure has been shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Some embodiments of the present disclosure are directed to a system, apparatus, and/or a communication device, which have a circuit. A circuit may be a collection of connected electrical and/or optical components. In some embodiments, the circuit may be formed on a substrate. A substrate may be a slice of a semiconductor material used for fabrication of integrated circuits. When an element is referred to herein as being "formed on" another element, it is to be understood that the element can be directly formed on the other element, or have intervening elements present between the elements. In some embodiments, the circuit may operate as a transformer and/or a balun. A transformer may be a passive component configured to transfer electromagnetic energy from one circuit to another circuit, or multiple circuits. A balun may be an electrical device that allows balanced and unbalanced lines to be interfaced without disturbing an impedance arrangement of either line. In some embodiments, the circuit may provide voltage-mode (VM) transmitter amplitude and linearity enhancement by being or operating as an integrated transformer (e.g., an integrated wideband transformer).

Referring now to FIGS. 1A-4, systems and methods for providing a circuit 106A or 106B (e.g., which may operate as a transformer, such as a wideband transformer) are described in greater detail, in accordance with one or more embodiments of the present disclosure. For example, the circuit 106A or 106B may be configured to enhance amplitude and linearity in accordance with one or more embodiments of the present disclosure.

Figure 1A:
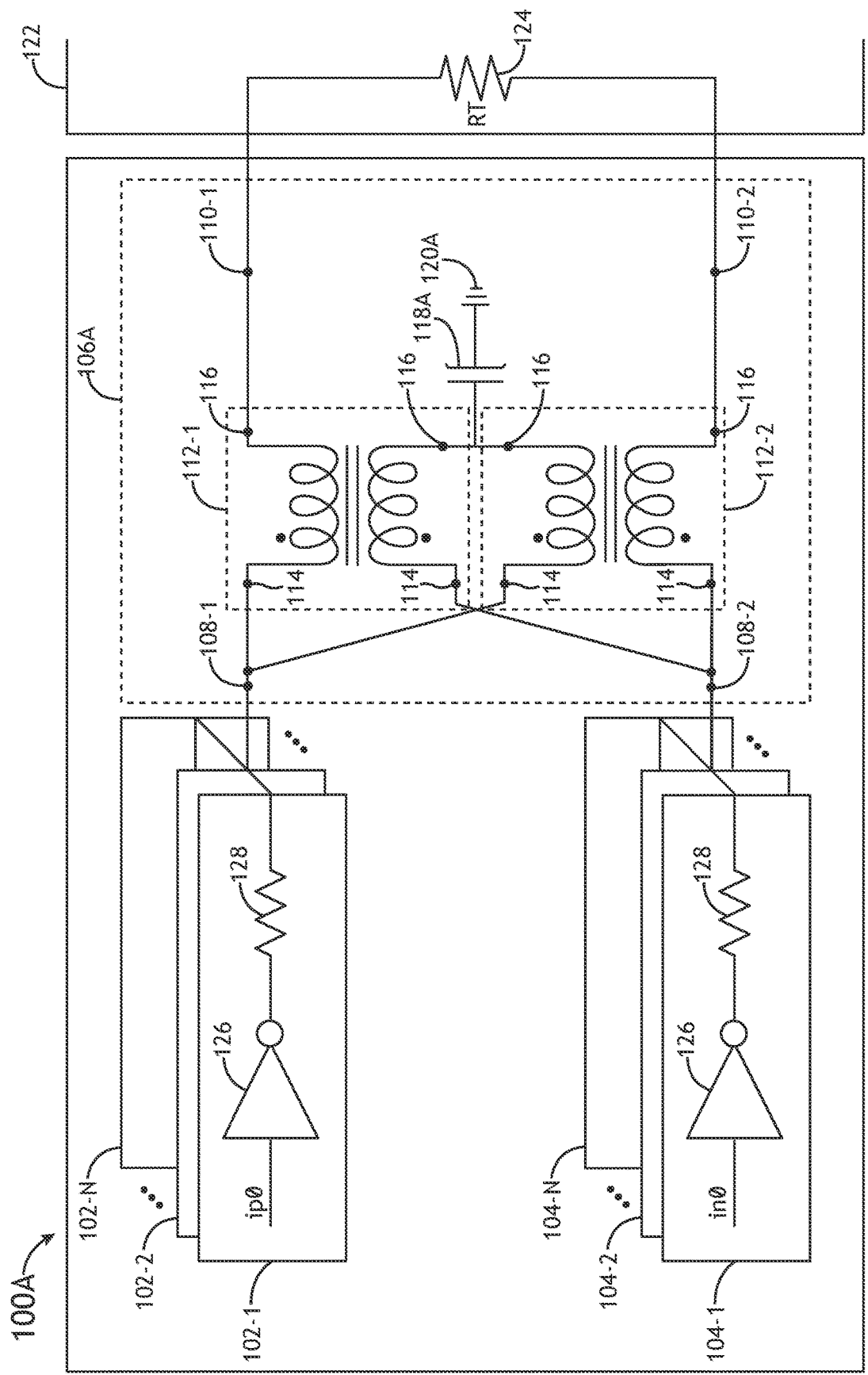
FIG. 1A is a conceptual diagram of an exemplary substrate including an exemplary circuit, in accordance with one or more embodiments of the present disclosure.
Figure 4:
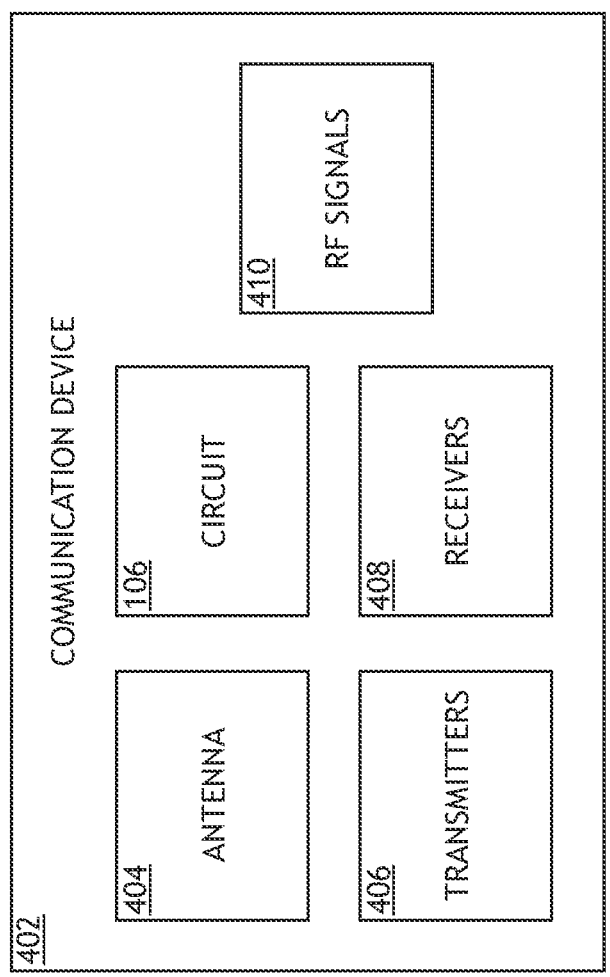
FIG. 4 is a block diagram view of the circuit of FIG. 1A or 1B implemented in a communication device, in accordance with one or more embodiments of the present disclosure.

FIG. 1A is a conceptual diagram of a substrate 100A that may have at least one first driver (e.g., 102-1, 102-2, ..., 102-N), at least one second driver (e.g., 102-1, 102-2, ..., 102-N), and/or a circuit 106A formed on the substrate 100A, in accordance with one or more embodiments of the present disclosure. In some embodiments, the substrate 100A may be connected to a device 122 (e.g., an antenna 404 or a transmitter 406, such as shown in FIG. 4) having a termination resistor (RT) 124.

In some embodiments, the substrate 100A may be formed of any suitable material, such as a semiconductor material (e.g., silicon, germanium, or gallium arsenide). In some embodiments, the substrate 100A, in combination with any suitable electronic devices (e.g., the driver(s) 102-1 ..., 102-N, the driver(s) 104-1, ..., 104-N, and/or the circuit 106A) formed on the substrate 100A, may form an integrated circuit (IC), a radiofrequency IC (RFIC), and/or a system on a chip (SoC).

In some embodiments, the substrate 100A may have at least one first driver (e.g., 102-1, 102-2, ..., 102-N) and/or at least one second driver (e.g., 102-1, 102-2, ..., 102-N) formed on the substrate 100A. In some embodiments, the at least one first driver (e.g., 102-1, 102-2, ..., 102-N) may be connected to a first input terminal 108-1 of the circuit 106A. In some embodiments, the at least one second driver (e.g., 104-1, 104-2, ..., 104-N) may be connected to a second input terminal 108-2 of the circuit 106A. In some embodiments, the at least one first driver (e.g., 102-1, 102-2, ..., 102-N) may be a single first driver 102-1. In some embodiments, the at least one second driver (e.g., 104-1, 104-2, ..., 104-N) may be a single second driver 104-1. In some embodiments including multiple first drivers (e.g., 102-1, 102-2, ..., 102-N), some or all of the first drivers (e.g., 102-1, 102-2, ..., 102-N) may output signals (e.g., in parallel) with respect to other of the first drivers (e.g., 102-1, 102-2, ..., 102-N). In some embodiments including multiple second drivers (e.g., 104-1, 104-2, ..., 104-N), some or all of the second drivers (e.g., 104-1, 104-2, ..., 104-N) may output signals (e.g., in parallel) with respect to other of the second drivers (e.g., 104-1, 104-2, ..., 104-N). In some embodiments including multiple first drivers (e.g., 102-1, 102-2, ..., 102-N), some or all of the multiple first drivers (e.g., 102-1, 102-2, ..., 102-N) may output, for example (e.g., in parallel) and time synchronized, signals that may coalesce as one signal having multiple channels and/or multiple signal features, and such coalesced signal may be output to another electronic device (e.g., the circuit 106A). In some embodiments including multiple second drivers (e.g., 104-1, 104-2, . . . , 104-N), some or all of the multiple second drivers (e.g., 104-1, 104-2, . . . , 104-N) may output, for example (e.g., in parallel) and time synchronized, signals that may coalesce as one signal having multiple channels and/or multiple signal features, and such coalesced signal may be output to another electronic device (e.g., the circuit 106A).

In some embodiments, each of the at least one first driver (e.g., 102-1, 102-2, . . . 102-N) and/or at least one second driver (e.g., 104-1, 104-2, . . . , 104-N) may be any suitable electronic device configured to output (e.g., drive) a signal(s) to another electronic device (e.g., the circuit 106A). For example, each of the at least one first driver (e.g., 102-1, 102-2, . . . , 102-N) and/or at least one second driver (e.g., 104-1, 104-2, . . . , 104-N) may be a VM driver. For example, some or all of such signals may be output signals from VM driver(s); and in such embodiments, said driver(s) may be considered to operate as VM driver(s). In some embodiments, each of such VM drivers may include at least one inverter 126 (e.g., a complementary metal-oxide semiconductor (CMOS) inverter) and at least one resistor 128 (e.g., linear resistors connected in series) configured to achieve a desired impedance, some or all of which may be connected to one another. In some embodiments, such VM drivers may operate as VM digital-to-analog converters (DACs).

In some embodiments, the substrate 100A may have the circuit 106A formed on the substrate 100A.

In some embodiments, the circuit 106A may have at least one first transformer (e.g., a first transformer 112-1), at least one second transformer (e.g., a second transformer 112-2), at least one capacitor (e.g., a capacitor 118A), at least one ground (e.g., a ground 120A), at least one first input terminal (e.g., a first input terminal 108-1), at least one second input terminal (e.g., a second input terminal 108-2), at least one first output terminal (e.g., a first output terminal 110-1), and/or at least one second output terminal (e.g., a second output terminal 110-2).

The first transformer 112-1 may have first input nodes 114 and first output nodes 116. In some embodiments, the first transformer 112-1 may have a 1:1 voltage conversion ratio. The first transformer 112-1 may be a passive component configured to transfer electromagnetic energy from one circuit to another circuit, or multiple circuits.

The second transformer 112-2 may have second input nodes 114 and second output nodes 116. In some embodiments, the second transformer 112-2 may have a 1:1 voltage conversion ratio. The second transformer 112-2 may be a passive component configured to transfer electromagnetic energy from one circuit to another circuit, or multiple circuits.

The first input nodes 114 of the first transformer 112-1 and the second input nodes 114 of the second transformer 112-2 may be connected (e.g., in parallel). At least one (e.g., one or two) first output node 116 of the first output nodes 116 of the first transformer 112-1 and at least one (e.g., one or two) second output node 116 of the second output nodes 116 of the second transformer 112-2 may be connected (e.g., in series).

In some embodiments, the first transformer 112-1 and the second transformer 112-2 may have identical size, construction, and/or electrical properties.

The first input terminal 108-1 may be connected (e.g., in parallel) to a first 114 of the first input nodes 114 and to a first 114 of the second input nodes 114. The second input terminal 108-2 may be connected (e.g., in parallel) to a second 114 of the first input nodes 114 and to a second 114 of the second input nodes 114.

The first output terminal 110-1 may be connected to one or more on- and/or off-substrate devices 122 (e.g., at least one transmitter 406 and/or at least one antenna 404, as shown in FIG. 4). The second output terminal 110-2 may be connected to one or more on- and/or off-substrate devices 122 (e.g., the at least one transmitter 406 and/or the at least one antenna 404, as shown in FIG. 4).

The capacitor 118A (e.g., a first plate of the capacitor 118A) may be connected both to one 116 of the first output nodes 116 of the first transformer 112-1 and to one 116 of the second output nodes 116 of the second transformer 112-2.

The ground 120A may be connected to the capacitor 118A (e.g., a second plate of the capacitor 118A). In some embodiments, the capacitor 118A may be configured to receive common-mode (CM) signals from the first transformer 112-1 and the second transformer 112-2. Common-mode signals may be the voltage common to both input terminals of an electrical device.

In some embodiments, the circuit 106A may be configured to receive at least one first input signal from at least one first driver 102 (e.g., 102-1, 102-2, . . . , 102-N). In some embodiments, the circuit 106A may be configured to receive at least one second input signal from at least one second driver (e.g., 104-1, 104-2, . . . , 104-N). In some embodiments, each of the at least one first input signal may be a first voltage-mode (VM) signal, and each of the at least one second input signal may be a second VM signal. In some embodiments, the circuit 106A may be configured to output common-mode (CM) and differential signals at the first output terminal 110-1 and the second output terminal 110-2.

In some embodiments, the circuit 106A may operate as and/or may be a transformer, such as a narrowband or wideband transformer. For example, wideband may refer to when a message bandwidth exceeds (e.g., significantly exceeds) a coherence bandwidth of a channel. In some embodiments, the circuit may operate as a transformer, which may be a passive component configured to transfer electromagnetic energy from one circuit to another circuit, or multiple circuits. For example, if the circuit 106A operates as a transformer, in some embodiments, the circuit 106A may have a 1:2 voltage conversion ratio and a 1:4 impedance conversion ratio; for example, the circuit 106A may boost the at least one driver output voltage by two times and may match an impedance to the termination resistor 124 by four times. In some embodiments, the circuit 106A may function similarly to existing Guanella transformers (which are well-known in the art) except, for example (and not limited to): that the circuit 106A may be implemented on-chip; and/or that the circuit 106A may include the capacitor 118A (e.g., which may be arranged and function as disclosed throughout) such that the circuit 106A may provide significant and unexpected advantages (such as disclosed throughout) over an existing Guanella transformer implementation.

In some embodiments, the circuit 106A may operate as a balun. In some embodiments, a balun may be an electrical device that allows balanced and unbalanced lines to be interfaced without disturbing the impedance arrangement of either line. In some embodiments, a balun can take many forms and may include devices that also transform impedances but need not do so. In some embodiments, a transformer balun may use magnetic coupling but need not do so. In some embodiments, the circuit 106A may operate as a balun and a transformer.

In some embodiments, the circuit 106A may be configured to boost an amplitude of a signal(s). In some embodiments, the circuit 106A may be further configured to improve a common-mode rejection ratio (CMRR) of the signal(s). In some embodiments, the circuit may be further configured to improve a single-ended distortion (HD2) of the signal(s). In some embodiments, the circuit 106A may be configured to simultaneously boost the amplitude of the signal(s), improve a common-mode rejection ratio (CMRR) of the signal(s), and improve a single-ended distortion (HD2) of the signal(s).

In some embodiments, the circuit 106A may be configured to provide a common-mode rejection ratio (CMRR) that enhances single-ended distortion (HD2) linearity.

In some embodiments, a first implementation using the circuit 106A formed on the substrate 100A may provide an improved amplitude and phase balance as compared to another implementation having an equivalent circuit formed externally (e.g., off-chip) to the substrate 100A.

In some embodiments, when the substrate 100A may have the at least one first driver (e.g., 102-1, 102-2, ..., 102-N), the at least one second driver (e.g., 104-1, 104-2, ..., 104-N), and the circuit 106A formed on the substrate 100A, such on-substrate implementation of such components may provide higher amplitude and phase balance compared to implementations where the circuit 106A is on the substrate 100A and the at least one first driver (e.g., 102-1, 102-2, ..., 102-N) and the at least one second driver (e.g., 104-1, 104-2, ..., 104-N) are on another substrate.

In some embodiments, when the substrate 100A may have the at least one first driver (e.g., 102-1, 102-2, ..., 102-N), the at least one second driver (e.g., 104-1, 104-2, ..., 104-N), and the circuit 106A formed on the substrate 100A, the circuit 106A may achieve a large output swing without causing voltage stress on output connected transistors. In some embodiments, when the substrate 100A may have the at least one first driver (e.g., 102-1, 102-2, ..., 102-N), the at least one second driver (e.g., 104-1, 104-2, ..., 104-N), and the circuit 106A formed on the substrate 100A, the circuit 106A may obviate a need for thick-oxide cascode devices often used in high-swing, high-voltage drivers (e.g. larger than technology's core supply voltage), which tend to slow down an output stage. In some embodiments, when the substrate 100A may have the at least one first driver (e.g., 102-1, 102-2, ..., 102-N), the at least one second driver (e.g., 104-1, 104-2, ..., 104-N), and the circuit 106A formed on the substrate 100A, a high CMRR (e.g. >30 dB) provided by the circuit 106A may significantly enhance single-ended HD2 linearity. In some embodiments, when the substrate 100A may have the at least one first driver (e.g., 102-1, 102-2, ..., 102-N), the at least one second driver (e.g., 104-1, 104-2, ..., 104-N), and the circuit 106A formed on the substrate 100A, large transmitter output swing may be achieved while having relaxed requirements on output driver device linearity. In some embodiments, when a system and/or apparatus includes the substrate 100A may have the at least one first driver (e.g., 102-1, 102-2, ..., 102-N), the at least one second driver (e.g., 104-1, 104-2, ..., 104-N), and the circuit 106A formed on the substrate 100A, the system and/or apparatus may provide highly-linear (>10 bits), high-swing digital-to-analog converter (DAC) drivers using low power supply voltages. In some embodiments, when a system and/or apparatus includes the substrate 100A having the at least one first driver (e.g., 102-1, 102-2, ..., 102-N), the at least one second driver (e.g., 102-1, 102-2, ..., 102-N), and the circuit 106A formed on the substrate 100A, the system and/or apparatus may provide large output power radiofrequency (RF) DAC transmitters with high linearity (>10-bits) and low power consumption (e.g., compared to DAC transmitters using cascode devices operating off higher than nominal supply voltages). In some embodiments, when a system and/or apparatus includes the substrate 100A having the at least one first driver (e.g., 102-1, 102-2, ..., 102-N), the at least one second driver (e.g., 104-1, 104-2, ..., 104-N), and the circuit 106A formed on the substrate 100A, the system and/or apparatus may reduce costs by not needing expensive off-chip baluns to meet single-ended HD2 linearity specifications.

In some embodiments, the circuit 106A may be used in apparati considered to be PHYs and apparati including RF and/or wireless transmitters.

Figure 1B:
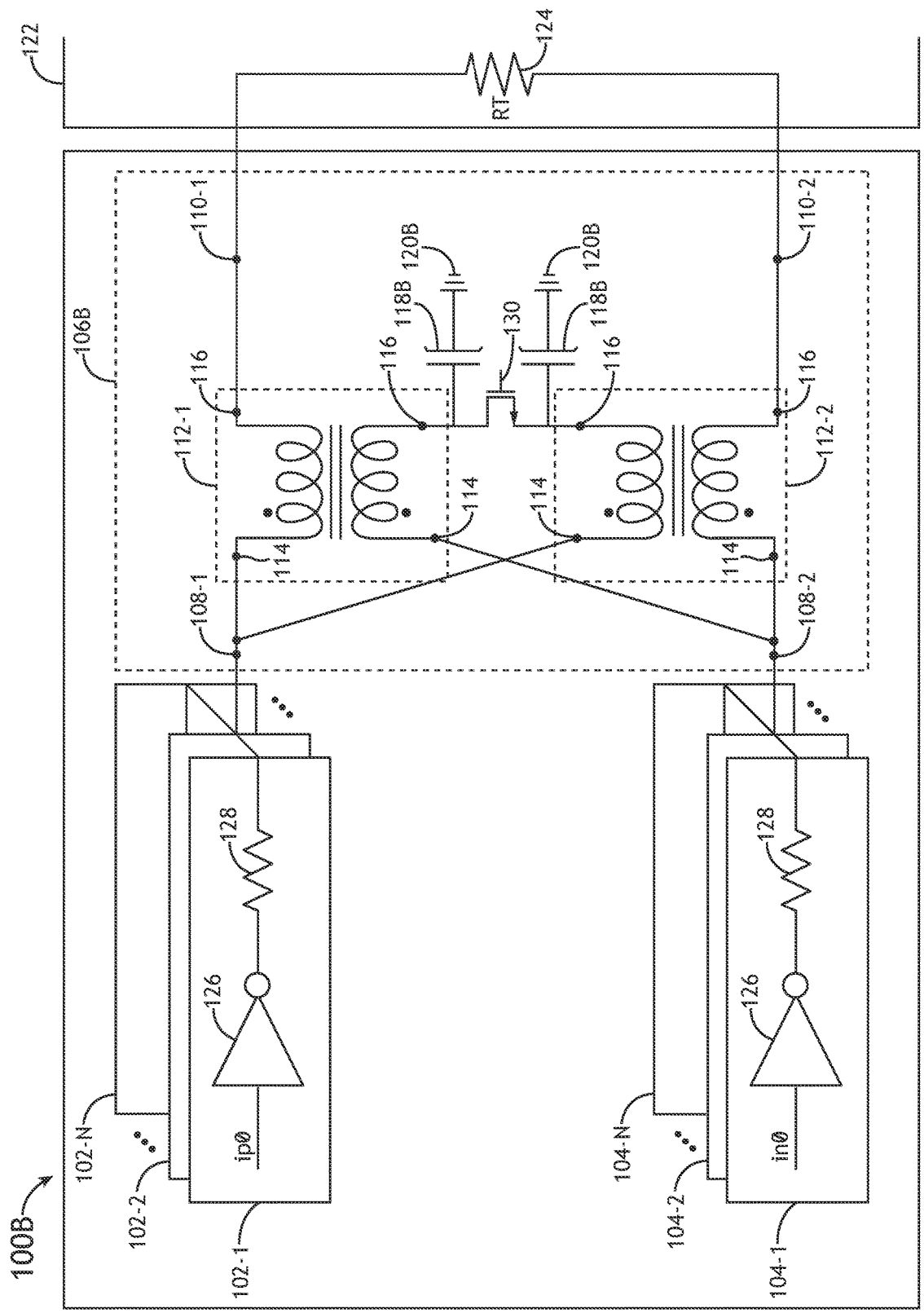
FIG. 1B is a conceptual diagram of another exemplary substrate including another exemplary circuit, in accordance with one or more embodiments of the present disclosure.

FIG. 1B is a conceptual diagram of a substrate 100B that may have at least one first driver (e.g., 102-1, 102-2, ..., 102-N), at least one second driver (e.g., 104-1, 104-2, ..., 104-N), and/or a circuit 106B formed on the substrate 100B, in accordance with one or more embodiments of the present disclosure. In some embodiments, the substrate 100B may be connected to a device 122 (e.g., an antenna 404 or a transmitter 406, such as shown in FIG. 4) having a termination resistor 124.

In some embodiments, the substrate 100B may be formed of any suitable material, such as a semiconductor material (e.g., silicon, germanium, or gallium arsenide). In some embodiments, the substrate 100B, in combination with any suitable electronic devices (e.g., the driver(s) 102-1 ..., 102-N, the driver(s) 104-1, ..., 104-N, and/or the circuit 106B) formed on the substrate 100B, may form an integrated circuit (IC), a radiofrequency IC (RFIC), and/or a system on a chip (SoC).

In some embodiments, the substrate 100B may have at least one first driver (e.g., 102-1, 102-2, ..., 102-N) and/or at least one second driver (e.g., 104-1, 104-2, ..., 104-N) formed on the substrate 100B. In some embodiments, the at least one first driver (e.g., 102-1, 102-2, ..., 102-N) may be connected to a first input terminal 108-1 of the circuit 106A. In some embodiments, the at least one second driver (e.g., 104-1, 104-2, ..., 104-N) may be connected to a second input terminal 108-2 of the circuit 106A. In some embodiments, the at least one first driver (e.g., 102-1, 102-2, ..., 102-N) may be a single first driver 102-1. In some embodiments, the at least one second driver (e.g., 104-1, 104-2, ..., 104-N) may be a single second driver 104-1. In some embodiments including multiple first drivers (e.g., 102-1, 102-2, ..., 102-N), some or all of the first drivers (e.g., 102-1, 102-2, ..., 102-N) may output signals (e.g., in parallel) with respect to other of the first drivers (e.g., 102-1, 102-2, ..., 102-N). In some embodiments including multiple second drivers (e.g., 104-1, 104-2, ..., 104-N), some or all of the multiple second drivers (e.g., 104-1, 104-2, ..., 104-N) may output, for example (e.g., in parallel) and time synchronized, signals that may coalesce as one signal having multiple channels and/or multiple signal features, and such coalesced signal may be output to another electronic device (e.g., the circuit 106B).

In some embodiments, each of the at least one first driver (e.g., 102-1, 102-2, ... 102-N) and/or at least one second driver (e.g., 104-1, 104-2, ..., 104-N) may be any suitable electronic device configured to output (e.g., drive) a signal(s) to another electronic device (e.g., the circuit 106B). For example, each of the at least one first driver (e.g., 102-1, 102-2, ..., 102-N) and/or at least one second driver (e.g., 104-1, 104-2, ..., 104-N) may be a VM driver. For example, some or all of such signals may be output signals from VM driver(s); and in such embodiments, said driver(s) may be considered to operate as VM driver(s). In some embodiments, each of such VM drivers may include at least one inverter 126 (e.g., a complementary metal-oxide semiconductor (CMOS) inverter) and at least one resistor 128 (e.g., linear resistors connected in series) configured to achieve a desired impedance, some or all of which may be connected to one another. In some embodiments, such VM drivers may operate as VM digital-to-analog converters (DACs).

In some embodiments, the substrate 100B may have the circuit 106B formed on the substrate 100B.

In some embodiments, the circuit 106B may have at least one first transformer (e.g., a first transformer 112-1), at least one second transformer (e.g., a second transformer 112-2), at least two capacitors (e.g., a first capacitor 118B and a second capacitor 118B), at least two grounds (e.g., a first ground 120B and a second ground 120B), at least one first input terminal (e.g., a first input terminal 108-1), at least one second input terminal (e.g., a second input terminal 108-2), at least one first output terminal (e.g., a first output terminal 110-1), and/or at least one second output terminal (e.g., a second output terminal 110-2).

The first transformer 112-1 may have first input nodes 114 and first output nodes 116. In some embodiments, the first transformer 112-1 may have a 1:1 voltage conversion ratio. The first transformer 112-1 may be a passive component configured to transfer electromagnetic energy from one circuit to another circuit, or multiple circuits.

The second transformer 112-2 may have second input nodes 114 and second output nodes 116. In some embodiments, the second transformer 112-2 may have a 1:1 voltage conversion ratio. The second transformer 112-2 may be a passive component configured to transfer electromagnetic energy from one circuit to another circuit, or multiple circuits.

The first input nodes 114 of the first transformer 112-1 and the second input nodes 114 of the second transformer 112-2 may be connected (e.g., in parallel). At least one (e.g., one or two) first output node 116 of the first output nodes 116 of the first transformer 112-1 and at least one (e.g., one or two) second output node 116 of the second output nodes 116 of the second transformer 112-2 may be connected (e.g., in series).

In some embodiments, the first transformer 112-1 and the second transformer 112-2 may have identical size, construction, and/or electrical properties.

The first input terminal 108-1 may be connected (e.g., in parallel) to a first 114 of the first input nodes 114 and to a first 114 of the second input nodes 114. The second input terminal 108-2 may be connected (e.g., in parallel) to a second 114 of the first input nodes 114 and to a second 114 of the second input nodes 114.

The first output terminal 110-1 may be connected to one or more on- and/or off-substrate devices 122 (e.g., at least one transmitter 406 and/or at least one antenna 404, as shown in FIG. 4). The second output terminal 110-2 may be connected to one or more on- and/or off-substrate devices 122 (e.g., the at least one transmitter 406 and/or the at least one antenna 404, as shown in FIG. 4).

Each of the first capacitor 118B and the second capacitor 118B (e.g., each of a first plate of the first capacitor 118B and a first plate of the second capacitor 118B) may be connected to one 116 of the first output nodes 116 of the first transformer 112-1 and to one 116 of the second output nodes 116 of the second transformer 112-2.

Each of the first ground 120B and the second ground 120B may be connected to one of the first capacitor 118B (e.g., a second plate of the first capacitor 118B) or the second capacitor 118B (e.g., a second plate of the second capacitor 118B). In some embodiments, each capacitor 118B may be configured to receive common-mode (CM) signals from the first transformer 112-1 and the second transformer 112-2.

The first capacitor 118B may be connected between one 116 of the first output nodes 116 of the first transformer 112-1 and the switch 130. The second capacitor 118B may be connected between one 116 of the second output nodes 116 of the second transformer 112-2 and the switch 130.

In some embodiments, each of the first capacitor 118B and the second capacitor 118B may have identical construction and electrical properties. For example, each of the first capacitor 118B and the second capacitor 118B may have half the capacitance of the capacitor 118A of the circuit 106A of FIG. 1A when the circuits 106A and 106B have similar or identical electrical properties.

The switch 130 may be implemented as any suitable switch, such as an enable switch. The switch 130 may be implemented at a common-mode node between the first transformer 112-1 and the second transformer 112-2. The switch 130 may be used to disable the circuit 106B from operating as a transformer and to avoid associated static current consumption when there is no alternating current (AC) input signal. In some embodiments, the switch 130 may be large enough to minimize the switch's on-resistance (e.g., to much less than 1 ohm) and associated power loss in the circuit 106B.

In some embodiments, the circuit 106B may be configured to receive at least one first input signal from at least one first driver 102 (e.g., 102-1, 102-2, . . . , 102-N). In some embodiments, the circuit 106B may be configured to receive at least one second input signal from at least one second driver (e.g., 104-1, 104-2, . . . , 104-N). In some embodiments, each of the at least one first input signal may be a first voltage-mode (VM) signal, and each of the at least one second input signal may be a second VM signal. In some embodiments, the circuit 106B may be configured to output common-mode (CM) and differential signals at the first output terminal 110-1 and the second output terminal 110-2.

In some embodiments, the circuit 106B may operate as and/or may be a transformer, such as a narrowband or wideband transformer. For example, wideband may refer to when a message bandwidth exceeds (e.g., significantly exceeds) a coherence bandwidth of a channel. In some embodiments, the circuit may operate as a transformer, which may be a passive component configured to transfer electromagnetic energy from one circuit to another circuit, or multiple circuits. For example, if the circuit 106B operates as a transformer, in some embodiments, the circuit 106B may have a 1:2 voltage conversion ratio and a 1:4 impedance conversion ratio; for example, the circuit 106B may boost the at least one driver output voltage by two times and may match an impedance to the termination resistor 124 by four times. In some embodiments, the circuit 106B may function similarly to existing Guanella transformers (which are well-known in the art) except, for example (and not limited to): that the circuit 106B may be implemented on-chip; that the circuit 106B may include the capacitors 118B (e.g., which may be arranged and function as disclosed throughout) such that the circuit 106B may provide significant and unexpected advantages (such as disclosed throughout) over an existing Guanella transformer implementation; and/or that the circuit 106B may include the switch 130 (e.g., which may be arranged and function as disclosed throughout).

In some embodiments, the circuit 106B may operate as a balun. In some embodiments, a balun may be an electrical device that allows balanced and unbalanced lines to be interfaced without disturbing the impedance arrangement of either line. In some embodiments, a balun can take many forms and may include devices that also transform impedances but need not do so. In some embodiments, a transformer balun may use magnetic coupling but need not do so. In some embodiments, the circuit 106B may operate as a balun and a transformer.

In some embodiments, the circuit 106B may be configured to boost an amplitude of a signal(s). In some embodiments, the circuit 106B may be further configured to improve a common-mode rejection ratio (CMRR) of the signal(s). In some embodiments, the circuit may be further configured to improve a single-ended distortion (HD2) of the signal(s). In some embodiments, the circuit 106B may be configured to simultaneously boost the amplitude of the signal(s), improve a common-mode rejection ratio (CMRR) of the signal(s), and improve a single-ended distortion (HD2) of the signal(s).

In some embodiments, the circuit 106B may be configured to provide a common-mode rejection ratio (CMRR) that enhances single-ended linearity (HD2).

In some embodiments, a first implementation using the circuit 106B formed on the substrate 100B may provide an improved amplitude and phase balance as compared to another implementation having an equivalent circuit formed externally (e.g., off-chip) to the substrate 100B.

In some embodiments, when the substrate 100B may have the at least one first driver (e.g., 102-1, 102-2, . . . , 102-N), the at least one second driver (e.g., 104-1, 104-2, . . . , 104-N), and the circuit 106B formed on the substrate 100B, such on-substrate implementation of such components may provide higher amplitude and phase balance compared to implementations where the circuit 106B is on the substrate 100B and the at least one first driver (e.g., 102-1, 102-2, . . . , 102-N) and the at least one second driver (e.g., 104-1, 104-2, . . . , 104-N) are on another substrate.

In some embodiments, when the substrate 100B may have the at least one first driver (e.g., 102-1, 102-2, . . . , 102-N), the at least one second driver (e.g., 104-1, 104-2, . . . , 104-N), and the circuit 106B formed on the substrate 100B, the circuit 106B may achieve a large output swing without causing voltage stress on output connected transistors. In some embodiments, when the substrate 100B may have the at least one first driver (e.g., 102-1, 102-2, . . . , 102-N), the at least one second driver (e.g., 104-1, 104-2, . . . , 104-N), and the circuit 106B formed on the substrate 100B, the circuit 106B may obviate a need for thick-oxide cascode devices often used in high-swing, high-voltage drivers (e.g. larger than technology's core supply voltage), which tend to slow down an output stage. In some embodiments, when the substrate 100B may have the at least one first driver (e.g., 102-1, 102-2, . . . , 102-N), the at least one second driver (e.g., 104-1, 104-2, . . . , 104-N), and the circuit 106B formed on the substrate 100B, a high CMRR (e.g. >30 dB) provided by the circuit 106B may significantly enhance single-ended HD2 linearity. In some embodiments, when the substrate 100B may have the at least one first driver (e.g., 102-1, 102-2, . . . , 102-N), the at least one second driver (e.g., 104-1, 104-2, . . . , 104-N), and the circuit 106B formed on the substrate 100B, large transmitter output swing may be achieved while having relaxed requirements on output driver device linearity. In some embodiments, when a system and/or apparatus includes the substrate 100B having the at least one first driver (e.g., 102-1, 102-2, . . . , 102-N), the at least one second driver (e.g., 104-1, 104-2, . . . , 104-N), and the circuit 106B formed on the substrate 100B, the system and/or apparatus may provide highly-linear (>10 bits), high-swing digital-to-analog converter (DAC) drivers using low power supply voltages. In some embodiments, when a system and/or apparatus includes the substrate 100B having the at least one first driver (e.g., 102-1, 102-2, . . . , 102-N), the at least one second driver (e.g., 104-1, 104-2, . . . , 104-N), and the circuit 106B formed on the substrate 100B, the system and/or apparatus may provide large output power radiofrequency (RF) DAC transmitters with high linearity (>10-bits) and low power consumption (e.g., compared to DAC transmitters using cascode devices operating off higher than nominal supply voltages). In some embodiments, when a system and/or apparatus includes the substrate 100B having the at least one first driver (e.g., 102-1, 102-2, . . . , 102-N), the at least one second driver (e.g., 104-1, 104-2, . . . , 104-N), and the circuit 106B formed on the substrate 100B, the system and/or apparatus may reduce costs by not needing expensive off-chip baluns to meet single-ended HD2 linearity specifications.

In some embodiments, the circuit 106B may be used in apparati considered to be PHYs and apparati including RF and/or wireless transmitters.

Referring generally to FIGS. 1A-1B, in some embodiments, the system may include the circuit 106A or 106B, the at least one first driver (e.g., 102-1, 102-2, . . . , 102-N), and/or the at least one second driver (e.g., 104-1, 104-2, . . . , 104-N). The circuit 106A or 106B may include a first transformer 112-1 having first input nodes 114 and first output nodes 116. The circuit 106A or 106B may further include a second transformer 112-2 having second input nodes 114 and second output nodes 116. The first input nodes 114 of the first transformer 112-1 and the second input nodes 114 of the second transformer 112-2 may be connected. At least one first output node 116 of the first output nodes 116 of the first transformer 112-1 and at least one second output node 116 of the second output nodes 116 of the second transformer 112-2 may be connected. The circuit 106A or 106B may further include a first capacitor 118A or 118B connected to one of the first output nodes 116 of the first transformer 112-1 and to one of the second output nodes 116 of the second transformer 112-2. The first capacitor 118A or 118B may be connected to a first ground 120A or 120B. The circuit 106A or 106B may include a first input terminal 108-1 connected to a first 114 of the first input nodes 114 and to a first 114 of the second input nodes 114. The circuit 106A or 106B may include a second input terminal 108-2 connected to a second 114 of the first input nodes 114 and to a second 114 of the second input nodes 114. The circuit 106A or 106B may include a first output terminal 110-1 and a second output terminal 110-2. The at least one first driver (e.g., 102-1, 102-2, . . . , 102-N) may be connected to the first input terminal 108-1. The at least one second driver (e.g., 104-1, 104-2, . . . , 104-N) may be connected to the second input terminal 108-2. The circuit 106A or 106B may be configured to: receive at least one first input signal from the at least one first driver (e.g., 102-1, 102-2, . . . , 102-N); and receive at least one second input signal from the at least one second driver (e.g., 104-1, 104-2, . . . , 104-N).

Figure 2:
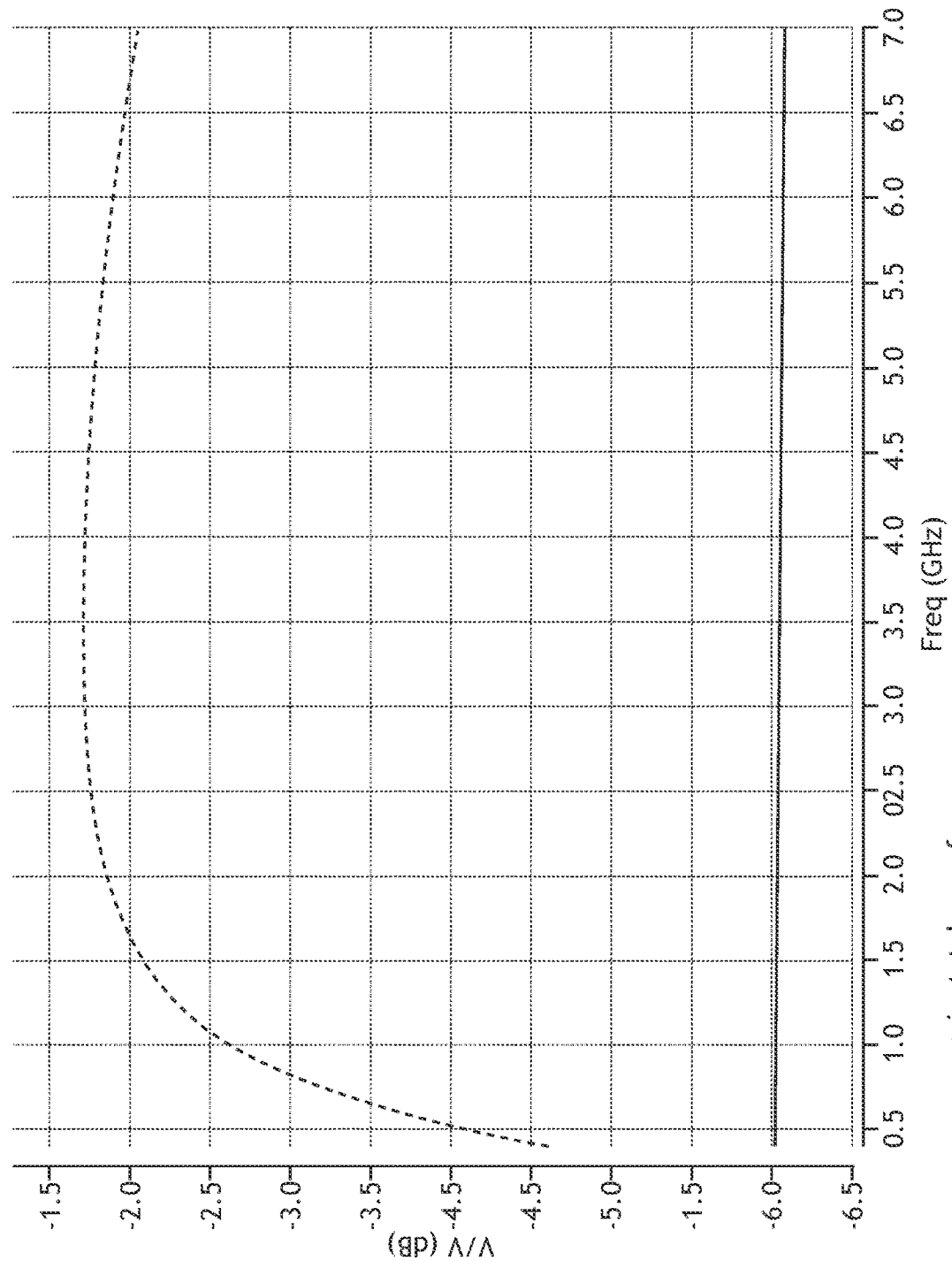
FIG. 2 is an exemplary plot of total alternating current (AC) gain against frequency of an exemplary implementation using the circuit 106A of FIG. 1A or circuit 106B of FIG. 1B compared against a plot of total AC gain against frequency for an existing implementation without the circuit 106A of FIG. 1A or circuit 106B of FIG. 1B, in accordance with one or more embodiments of the present disclosure.

FIG. 2 is an exemplary plot of total alternating current (AC) gain (V (dB)) against frequency (GHz) of an exemplary implementation using the circuit 106A or 106B compared against a plot of total AC gain against frequency for an existing implementation without the circuit 106A or 106B. The plot of total alternating current (AC) gain (V (dB)) versus frequency (GHz) of the exemplary implementation using the circuit 106A or 106B may be in accordance with one or more embodiments of the present disclosure.

Figure 3:
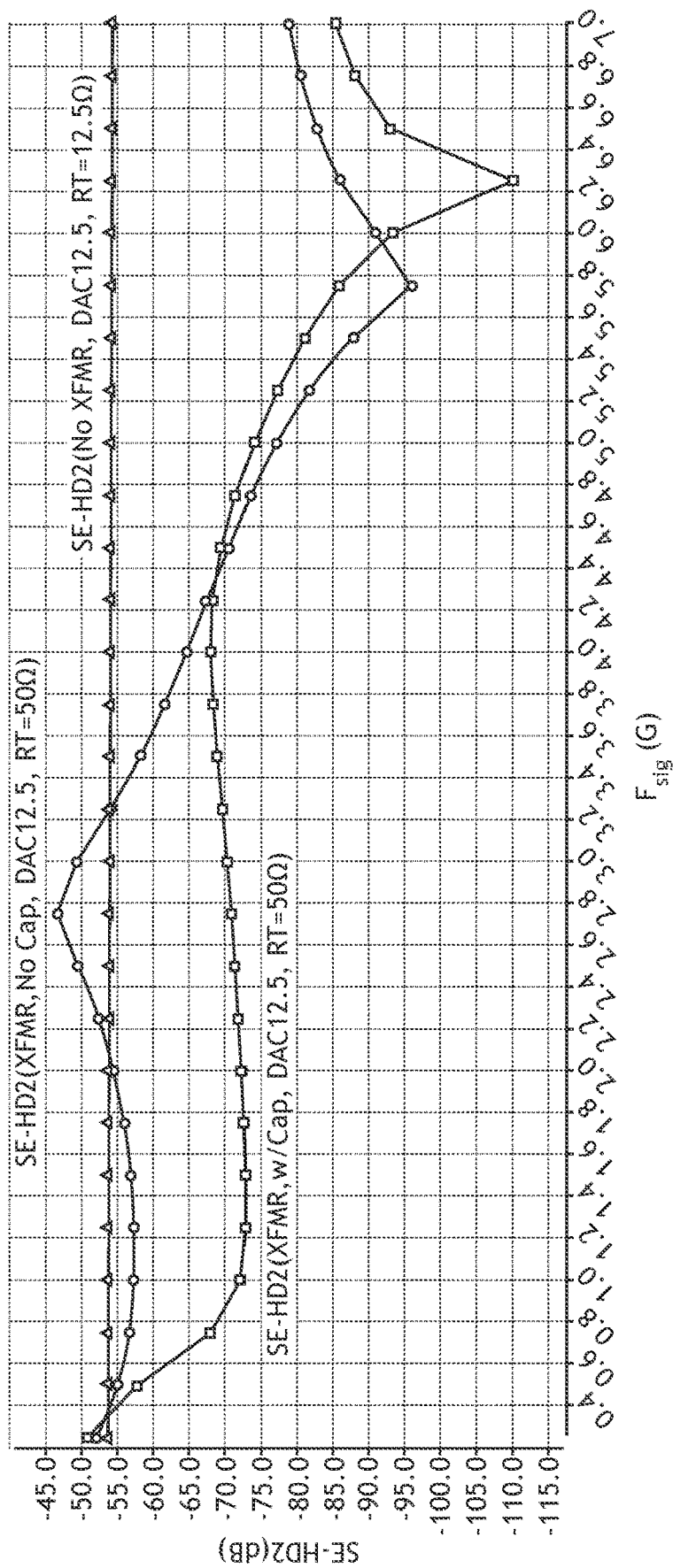
FIG. 3 is an exemplary plot of single-ended HD2 distortion against signal frequency of an exemplary implementation using the circuit of FIG. 1A or 1B compared against (a) a plot of single-ended HD2 distortion against signal frequency of an exemplary implementation using an existing Guanella transformer and (b) a plot of single-ended HD2 distortion against signal frequency of an exemplary implementation using an existing solution without a transformer, in accordance with one or more embodiments of the present disclosure.

FIG. 3 is an exemplary plot (labeled "SE-HD2 (XFMR, w/cap., DAC 12.5, RT=50Ω)") of single-ended HD2 distortion (in dB) against signal frequency ($F_{sig}$, in GHz) of an exemplary implementation using the circuit 106A or 106B compared against (a) a plot (labeled "SE-HD2 (XFMR, No cap., DAC 12.5, RT=50Ω)") of single-ended HD2 distortion against signal frequency of an exemplary implementation using an existing Guanella transformer and (b) a plot (labeled "SE-HD2 (No XFMR, DAC 12.5, RT=12.5Ω)") of single-ended HD2 distortion against signal frequency of an exemplary implementation using an existing solution without a transformer. The exemplary plot (labeled "SE-HD2 (XFMR, w/cap., DAC 12.5, RT=50Ω)") of single-ended HD2 distortion against signal frequency ($F_{sig}$, in GHz) of an exemplary implementation using the circuit 106A or 106B may be in accordance with one or more embodiments of the present disclosure. As can be seen, an implementation using the circuit 106A or 106B of one or more embodiments achieves significantly better single-ended HD2 distortion over the usable frequency range as compared to existing solutions. Additionally, as can be seen, the implementation using the circuit 106A or 106B of one or more embodiments increases CMRR, thus improving single-ended HD2 significantly as compared to baseline HD2 of the DAC. In some embodiments, on-chip integration of the circuit 106A or 106B with a VM DAC may be configured to boost a transmit output power and improve single-ended HD2 linearity via the at least one capacitor (e.g., 118A and/or 118B) added to a CM node of the circuit 106A or 106B.

Referring now to FIG. 4, FIG. 4 is a block diagram view of the circuit 106A or 106B (which is generically shown as circuit 106 in FIG. 4) of FIG. 1A or 1B implemented in a communication device 402, in accordance with one or more embodiments of the present disclosure. It is contemplated herein that the circuit 106A or 106B may be used in any communication device 402 including, but not limited to, a mobile phone, a laptop computer, a vehicular device, a wearable device (e.g., smart watches or head-wearable devices), a gaming console, a tablet, a wireless router, a base station, an edge computing device, or the like.

In some embodiments, a communication device 402 includes an antenna 404 coupled to the circuit 106A or 106B, one or more transmitters 406, and/or receivers 408 to facilitate the transmission and/or reception of RF signals 410. The RF signals 410 may have any frequency or frequency ranges such as, but not limited to, MHz to GHz frequencies. Further, the RF signals 410 may be within any designated frequency bands such as, but not limited to, 5G bands or LTE bands.

In some embodiments, the communication device 402 includes the circuit 106A or 106B coupled to the transmitters 406, the receivers 408, and/or the antenna 404. For example, the communication device 402 may include one or more circuits 106A or 106B configured to: receive at least one first input signal from at least one first driver 102 (e.g., 102-1, 102-2, . . . , 102-N); receive at least one second input signal from at least one second driver (e.g., 104-1, 104-2, . . . , 104-N); and/or output common-mode (CM) and differential signals at the first output terminal 110-1 and the second output terminal 110-2 to one or more transmitters 406.

As an illustration, the communication device 402 may include a transmitter 406 to generate an RF signal 410 for transmission (e.g., as a transmitter output signal).

In some embodiments, the communication device 402 may include a circuit 106B. The circuit 106B may include a first transformer 112-1 having first input nodes 114 and first output nodes 116. The circuit 106B may further include a second transformer 112-2 having second input nodes 114 and second output nodes 116. The first input nodes 114 of the first transformer 112-1 and the second input nodes 114 of the second transformer 112-2 may be connected. At least one first output node 116 of the first output nodes 116 of the first transformer 112-1 and at least one second output node 116 of the second output nodes 116 of the second transformer 112-2 may be connected. The circuit 106B may further include a first capacitor 118B connected to one of the first output nodes 116 of the first transformer 112-1 and to one of the second output nodes 116 of the second transformer 112-2. The first capacitor 118B may be connected to a first ground 120B. The circuit 106B may include a second capacitor 118B connected to a second ground 120B. The circuit 106B may include a switch 130. The first capacitor 118B may be connected between one of the first output nodes 116 of the first transformer 112-1 and the switch 130. The second capacitor 118B may be connected between one of the second output nodes 116 of the second transformer 112-2 and the switch 130.

It is additionally contemplated herein that the circuit 106A or 106B may not be limited to mobile communication applications and may generally be used in any communication system. Accordingly, references to mobile communication systems herein are provided solely for illustrative purposes and are not limiting on the present disclosure.

As used throughout, while various components may be described or depicted as being "coupled" or "connected", any two components capable of being so associated can also be viewed as being "couplable" or "connectable", to each other to achieve the desired functionality. Specific examples of couplable or connectable include but are not limited to physically mateable, physically fixed relative to another component, and/or physically interacting components. Other examples include being optically coupled, such as being optically aligned and configured to direct an optical signal between two components. Also, while various components may be depicted as being connected or coupled directly, direct connection or direct coupling is not a requirement. For example, components may be indirectly coupled (e.g., couplable) through some interface, device, or intermediate component whether physically (e.g., physically mated), optically, mechanically (e.g., via dynamically movable and physically interactable components), electrically, or otherwise. For example, components may be in data communication (e.g., optical signal communication) with intervening components that are not illustrated or described. It may be appreciated that "data communication" refers to both direct and indirect data communication (e.g., there may be intervening components). In one example, being coupled is permanent (e.g., two components epoxied, fused, and/or the like). In another example, being coupled is reversible (e.g., being "removably" coupled/couplable). For example, "removably" coupled/couplable may mean being capable of being coupled and uncoupled repeatedly and/or non-destructively (e.g., such as by being coupled by being temporarily held, clamped, pinned, latched, positioned, and/or the like in place). For example, an optical connector, in at least some embodiments, may be removably coupled (e.g., couplable) to an optic system.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements.

However, the existence of a direct connection does not exclude other connections, in which intervening elements may be present.

Components of a circuit may be connected in various ways. As used throughout, a node may indicate a point of connection between circuit elements or portions thereof. Components connected to a node may be physically connected in any suitable manner. In some embodiments, components connected to a node share a common electrical contact and may thus be, but are not required to be, physically proximate. In some embodiments, components connected to a node are connected through one or more electrically-conductive pathways such as, but not limited to, traces or wires. As another example, a terminal may indicate a portion of a component suitable for connection to one or more additional components and/or external devices. For example, a component may include an input terminal, an output terminal, or any other suitable point of connection. It is to be understood, however, that any descriptions of the connections between circuit components using nodes and/or terminals is solely for illustrative purposes and does not imply any particular technique for connecting such components. Rather, the terms node and terminal are used interchangeably herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An apparatus, comprising:
   a substrate; and
   a circuit formed on the substrate, the circuit comprising:
   a first transformer having first input nodes and first output nodes;
   a second transformer having second input nodes and second output nodes, wherein the first input nodes of the first transformer and the second input nodes of the second transformer are connected, wherein at least one first output node of the first output nodes of the first transformer and at least one second output node of the second output nodes of the second transformer are connected;
   a first capacitor connected to one of the first output nodes of the first transformer and to one of the second output nodes of the second transformer, wherein the first capacitor is connected to a first ground;
   a switch; and
   a second capacitor connected between one of the second output nodes of the second transformer and the switch.

2. The apparatus of claim 1, wherein the circuit operates as a transformer.

3. The apparatus of claim 2, wherein the circuit has a 1:2 voltage conversion ratio and a 1:4 impedance conversion ratio.

4. The apparatus of claim 2, wherein the transformer is a wideband transformer.

5. The apparatus of claim 2, wherein the circuit operates as a balun and the transformer.

6. The apparatus of claim 1,
   wherein the first capacitor is connected between one of the first output nodes of the first transformer and the switch, wherein the second capacitor is connected to a second ground.

7. The apparatus of claim 6,
   wherein the circuit further comprises: a first input terminal connected to a first of the first input nodes and to a first of the second input nodes; a second input terminal connected to a second of the first input nodes and to a second of the second input nodes; a first output terminal; and a second output terminal;
   wherein the apparatus further comprises: at least one first driver formed on the substrate and connected to the first input terminal; and at least one second driver formed on the substrate and connected to the second input terminal;
   wherein the circuit is configured to: receive at least one first input signal from the at least one first driver; and receive at least one second input signal from the at least one second driver.

8. The apparatus of claim 1,
   wherein the circuit further comprises: a first input terminal connected to a first of the first input nodes and to a first of the second input nodes; a second input terminal connected to a second of the first input nodes and to a second of the second input nodes; a first output terminal; and a second output terminal;
   wherein the apparatus further comprises: at least one first driver formed on the substrate and connected to the first input terminal; and at least one second driver formed on the substrate and connected to the second input terminal;
   wherein the circuit is configured to: receive at least one first input signal from the at least one first driver; and receive at least one second input signal from the at least one second driver.

9. The apparatus of claim 8, wherein the at least one first driver is at least one first voltage-mode (VM) driver, wherein the at least one second driver is at least one second VM driver, wherein each of the at least one first input signal is a first signal from one of the at least one first VM driver, wherein each of the at least one second input signal is a second signal from one of the at least one second VM driver.

10. The apparatus of claim 9, wherein the circuit is configured to output common-mode (CM) and differential signals at the first output terminal and the second output terminal.

11. The apparatus of claim 1, wherein each of the first transformer and the second transformer has a 1:1 voltage conversion ratio.

12. The apparatus of claim 1, wherein the first capacitor is configured to receive common-mode (CM) signals from the first transformer and the second transformer.

13. A system, comprising:
a circuit, comprising:
a first transformer having first input nodes and first output nodes;
a second transformer having second input nodes and second output nodes, wherein the first input nodes of the first transformer and the second input nodes of the second transformer are connected, wherein at least one first output node of the first output nodes of the first transformer and at least one second output node of the second output nodes of the second transformer are connected; and
a first capacitor connected to one of the first output nodes of the first transformer and to one of the second output nodes of the second transformer, wherein the first capacitor is connected to a first ground;
a first input terminal connected to a first of the first input nodes and to a first of the second input nodes;
a second input terminal connected to a second of the first input nodes and to a second of the second input nodes;
a first output terminal; and
a second output terminal;
at least one first driver connected to the first input terminal; and
at least one second driver connected to the second input terminal;
wherein the circuit is configured to: receive at least one first input signal from the at least one first driver; and receive at least one second input signal from the at least one second driver;
wherein the at least one first driver is at least one first voltage-mode (VM) driver, wherein the at least one second driver is at least one second VM driver;
wherein each of the at least one first input signal is a first signal from one of the at least one first VM driver; and
wherein each of the at least one second input signal is a second signal from one of the at least one second VM driver.

14. The system of claim 13, wherein the circuit is configured to output common-mode (CM) and differential signals at the first output terminal and the second output terminal.

15. A communication device, comprising:
a circuit, comprising:
a first transformer having first input nodes and first output nodes;
a second transformer having second input nodes and second output nodes, wherein the first input nodes of the first transformer and the second input nodes of the second transformer are connected, wherein at least one first output node of the first output nodes of the first transformer and at least one second output node of the second output nodes of the second transformer are connected;
a first capacitor connected to one of the first output nodes of the first transformer and to one of the second output nodes of the second transformer, wherein the first capacitor is connected to a first ground;
a second capacitor connected to a second ground; and
a switch;
wherein the first capacitor is connected between one of the first output nodes of the first transformer and the switch, wherein the second capacitor is connected between one of the second output nodes of the second transformer and the switch.

16. The communication device of claim 15,
wherein the circuit further comprises: a first input terminal connected to a first of the first input nodes and to a first of the second input nodes; a second input terminal connected to a second of the first input nodes and to a second of the second input nodes; a first output terminal; and a second output terminal;
wherein the communication device further comprises: at least one first driver connected to the first input terminal; and at least one second driver connected to the second input terminal;
wherein the circuit is configured to: receive at least one first input signal from the at least one first driver; and receive at least one second input signal from the at least one second driver.

17. The communication device of claim 16, wherein the at least one first driver is at least one first voltage-mode (VM) driver, wherein the at least one second driver is at least one second VM driver, wherein each of the at least one first input signal is a first signal from one of the at least one first VM driver, wherein each of the at least one second input signal is a second signal from one of the at least one second VM driver.

18. The communication device of claim 17, wherein the circuit is configured to output common-mode (CM) and differential signals at the first output terminal and the second output terminal.

19. The communication device of claim 15, wherein the circuit has a 1:2 voltage conversion ratio and a 1:4 impedance conversion ratio, wherein each of the first transformer and the second transformer has a 1:1 voltage conversion ratio.

\* \* \* \* \*